United States Patent
Namba (10) Patent No.: US 9,508,567 B2
(45) Date of Patent: Nov. 29, 2016

(54) CLEANING JIG AND CLEANING METHOD FOR CLEANING SUBSTRATE PROCESSING APPARATUS, AND SUBSTRATE PROCESSING SYSTEM

(71) Applicant: Tokyo Electron Limited, Tokyo (JP)

(72) Inventor: Hiromitsu Namba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 490 days.

(21) Appl. No.: 14/101,583

(22) Filed: Dec. 10, 2013

(65) Prior Publication Data
US 2014/0182631 A1    Jul. 3, 2014

(30) Foreign Application Priority Data
Dec. 28, 2012   (JP) ................................. 2012-288286

(51) Int. Cl.
*H01L 21/67*    (2006.01)
*H01L 21/687*   (2006.01)

(52) U.S. Cl.
CPC ... *H01L 21/67051* (2013.01); *H01L 21/68735* (2013.01); *H01L 21/68792* (2013.01)

(58) Field of Classification Search
None
See application file for complete search history.

(56) References Cited

U.S. PATENT DOCUMENTS

2011/0000509 A1*  1/2011  Chen ................... G03F 7/162
                                            134/22.18

FOREIGN PATENT DOCUMENTS

| JP | 09232276 A | * | 9/1997 |
| JP | 10-154679 A | | 6/1998 |
| JP | 2000-315671 A | | 11/2000 |

OTHER PUBLICATIONS

English Machine Translation of JP 09-232276 A.*

* cited by examiner

*Primary Examiner* — Nicole Blan
(74) *Attorney, Agent, or Firm* — Abelman, Frayne & Schwab (57) ABSTRACT

Disclosed is a method of cleaning components of a substrate processing apparatus The components of the substrate processing apparatus are cleaned by using a first cleaning jig including a disk-shaped lower member, and a disk-shaped upper member connected to the lower member and forming a gap between the upper member and the lower member. The lower member of the first cleaning jig is held by the substrate holding unit to rotate the first cleaning jig. The cleaning liquid is ejected toward the first cleaning jig from a bottom side of the first cleaning jig while the first cleaning jig is rotated. The cleaning liquid flows out toward outside of the first cleaning jig via the gap between the upper member and the lower member by a centrifugal force, and the components of the substrate processing apparatus are cleaned by the cleaning liquid that has flowed out.

8 Claims, 7 Drawing Sheets

CLEANING JIG AND CLEANING METHOD FOR CLEANING SUBSTRATE PROCESSING APPARATUS, AND SUBSTRATE PROCESSING SYSTEM

CROSS-REFERENCE TO RELATED APPLICATIONS

This application is based on and claims priority from Japanese Patent Application No. 2012-288286, filed on Dec. 28, 2012, with the Japan Patent Office, the disclosure of which is incorporated herein in its entirety by reference.

TECHNICAL FIELD

The present disclosure relates to a technology of cleaning a substrate processing apparatus.

BACKGROUND

A liquid processing process is one of several processes of manufacturing a semiconductor device, in which a substrate such as, for example, a semiconductor wafer (hereinafter, simply referred to as a "wafer") is rotated around a vertical axis, and a processing liquid is supplied to the rotating substrate. The processing liquid scattered from the substrate by a centrifugal force is received and collected by a cup that surrounds the circumference of the substrate. When the bottom surface or the periphery of the substrate is processed, the process is performed in a state where the top surface of the substrate is covered with a top plate (also referred to as an upper plate or a cover member) in order to suppress the processing liquid scattered from the substrate from being attached on the top surface of the substrate. When the process is repeated, deposits which are formed from dried and solidified processing liquids or reaction products are gradually deposited on the cup or the top plate. Since a release of such deposits causes particles, members around the substrate, such as the cup, and the top plate are regularly cleaned.

Japanese Patent Laid-Open Publication No. 2000-315671 discloses a cleaning substrate (cleaning jig) configured to clean a cup. A plurality of inclined surfaces of which height is increased toward the periphery of a substrate are intermittently disposed in a circumferential direction on the peripheral portion of the top surface of the cleaning substrate. When the cleaning substrate is rotated by being held by a spin chuck, and a cleaning liquid is supplied to the central portion of the top surface of the cleaning substrate, the cleaning liquid is diffused outward by a centrifugal force. Here, the cleaning liquid that passes along the inclined surfaces is scattered toward a higher position of the cup, and the cleaning liquid that does not pass along the inclined surfaces is scattered toward a lower position of the cup. By this, several height positions of the cup may be cleaned.

However, in a substrate processing apparatus which is configured to process a wafer by supplying a processing liquid to the bottom surface of the wafer but is not provided with a nozzle configured to supply a processing liquid or a cleaning liquid to the top surface of the wafer, even through the cleaning substrate as described above is used, a cup portion higher than the bottom surface of the cleaning substrate cannot be cleaned. In such a substrate processing apparatus, in order to clean a position higher than the bottom surface of the cleaning substrate by using the cleaning substrate, it is contemplated to provide a dedicated cleaning liquid nozzle configured to supply a cleaning liquid to the top surface of the wafer, but this results in an increase of a device cost.

SUMMARY

The present disclosure provides a method of cleaning a substrate processing apparatus to clean components of the substrate processing apparatus, the components having been positioned around a product substrate held by a substrate holding unit at the time of liquid processing of the product substrate, the method including: providing a first cleaning jig which includes a disk-shaped lower member having an opening formed at a central portion thereof, and a disk-shaped upper member connected to the lower member and forming a gap between the upper member and the lower member; holding the lower member of the first cleaning jig by the substrate holding unit; rotating the substrate holding unit around a vertical axis to rotate the first cleaning jig; and ejecting a cleaning liquid toward the first cleaning jig from a bottom side of the first cleaning jig while the first cleaning jig is rotated, such that the cleaning liquid is passed through the opening of the lower member to reach a bottom surface of the upper member, in which the cleaning liquid that has reached the bottom surface of the upper member flows out toward outside of the first cleaning jig via the gap between the upper member and the lower member, and the components of the substrate processing apparatus are cleaned by the cleaning liquid that has flowed out.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A and 4B are views illustrating a cleaning jig, in which

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a method of cleaning components of a substrate processing apparatus at positions higher than a bottom surface of a product substrate held by a substrate holding unit, a cleaning jig and a substrate processing apparatus for performing the method, even in the substrate processing apparatus not provided with a unit configured to supply a cleaning liquid from the top side of the substrate holding unit.

An aspect of the present disclosure is to provide a method of cleaning a substrate processing apparatus to clean components of the substrate processing apparatus, the components having been positioned around a product substrate held by a substrate holding unit at the time of liquid processing of the product substrate, the method including: providing a first cleaning jig which includes a disk-shaped lower member having an opening formed at a central portion thereof, and a disk-shaped upper member connected to the lower member and forming a gap between the upper member and the lower member; holding the lower member of the first cleaning jig by the substrate holding unit; rotating the substrate holding unit around a vertical axis to rotate the first cleaning jig; and ejecting a cleaning liquid toward the first cleaning jig from a bottom side of the first cleaning jig while the first cleaning jig is rotated, such that the cleaning liquid is passed through the opening of the lower member to reach a bottom surface of the upper member, in which the cleaning liquid that has reached the bottom surface of the upper member flows out toward outside of the first cleaning jig via the gap between the upper member and the lower member, and the components of the substrate processing apparatus are cleaned by the cleaning liquid that has flowed out.

In the method, the lower member of the first cleaning jig is a disk-shaped member that has the same diameter as the product substrate processed by the substrate processing apparatus, and the upper member is a disk-shaped member that has a smaller diameter than the lower member.

In the method, an inclined guide portion is provided at a peripheral portion of a top surface of the lower member, and the cleaning liquid that flows on the top surface of the lower member toward the peripheral portion obliquely upwardly turns by the inclined guide portion to jump out from the lower member.

The method further includes changing at least one of an ejection flow rate of the cleaning liquid and a rotation speed of the first cleaning jig while the substrate processing apparatus is cleaned.

In the method, a ratio of one part of the cleaning liquid which reaches the bottom surface of the upper member, and then flows along the bottom surface of the upper member to be shaken off from a peripheral portion of the bottom surface, to another part of the cleaning liquid which falls on a top surface of the lower member from the bottom surface of the upper member, and is shaken off from a peripheral portion of the top surface is changed by changing a rotation speed of the first cleaning jig while the substrate processing apparatus is cleaned.

In the method, a ratio of one part of the cleaning liquid which reaches the bottom surface of the upper member, and then flows along the bottom surface of the upper member to be shaken off from a peripheral portion of the bottom surface, to another part of the cleaning liquid which falls on a top surface of the lower member from the bottom surface of the upper member, and is shaken off from a peripheral portion of the top surface is changed by changing an ejection flow rate of the cleaning liquid and a rotation speed of the first cleaning jig while the substrate processing apparatus is cleaned.

In the method, the cleaning liquid is ejected toward the first cleaning jig from a processing liquid nozzle which is configured to supply a processing liquid toward a central portion of a bottom surface of the product substrate from a bottom side of the product substrate held by the substrate holding unit when the product substrate is processed by the substrate processing apparatus.

In the method, a diameter of the opening of the lower member is smaller than a diameter of a liquid column of the cleaning liquid ejected toward the first cleaning jig, by which a part of the cleaning liquid ejected toward the first cleaning jig reaches the bottom surface of the upper member through the opening, and flows toward outside through the gap between the upper member and the lower member, and another part of the cleaning liquid ejected toward the first cleaning jig reaches a bottom surface of the lower member, and flows along the bottom surface of the lower member toward outside.

The method further includes: providing a second cleaning jig constituted by a disk-shaped member having a diameter corresponding to the product substrate processed by the substrate processing apparatus; holding the second cleaning jig by the substrate holding unit; rotating the substrate holding unit around the vertical axis to rotate the second cleaning jig; and ejecting the cleaning liquid toward a bottom surface of the second cleaning jig from a bottom side of the second cleaning jig while the second cleaning jig is rotated, such that the cleaning liquid flows along the bottom surface of the second cleaning jig toward outside, and is shaken off from the bottom surface of the second cleaning jig to clean a portion lower than a portion to be cleaned by the first cleaning jig.

Another aspect of the present disclosure is to provide a cleaning jig of a substrate processing apparatus including: a disk-shaped lower member having an opening formed at a central portion thereof; and a disk-shaped upper member connected to the lower member and forming a gap between the upper member and the lower member.

In the cleaning jig, the upper member has a smaller diameter than the lower member.

In the cleaning jig, an inclined guide portion is provided at a peripheral portion of the lower member, the inclined guide portion guiding a liquid that flows on a top surface of the lower member toward the peripheral portion to obliquely upwardly turn to jump out from the lower member.

A further aspect of the present disclosure is to provide a substrate processing apparatus including: a substrate holding unit configured to hold a substrate horizontally; a rotation driving mechanism configured to rotate the substrate holding unit around a vertical axis; a processing liquid nozzle configured to supply a processing liquid to a central portion of a bottom surface of the substrate held by the substrate holding unit; a cleaning jig storage unit configured to store the cleaning jig, the cleaning jig being capable of being held by the substrate holding unit, and a conveying arm configured to convey the cleaning jig between the cleaning jig storage unit and the substrate holding unit.

According to the present disclosure, the cleaning liquid collides the bottom surface of the upper member via the opening of the lower member, and flows toward the peripheral portion of the cleaning jig via a gap between the top surface of the lower member and the bottom surface of the upper member to be shaken off from the position equal to or higher than the top surface of the lower member toward outside. Even in a substrate processing apparatus not provided with a unit configured to supply the cleaning liquid from the top side of the substrate holding unit, components of the substrate processing apparatus at positions higher than a bottom surface of a product substrate held by a substrate holding unit at the time of processing of the product substrate may be cleaned.

Figure 1:
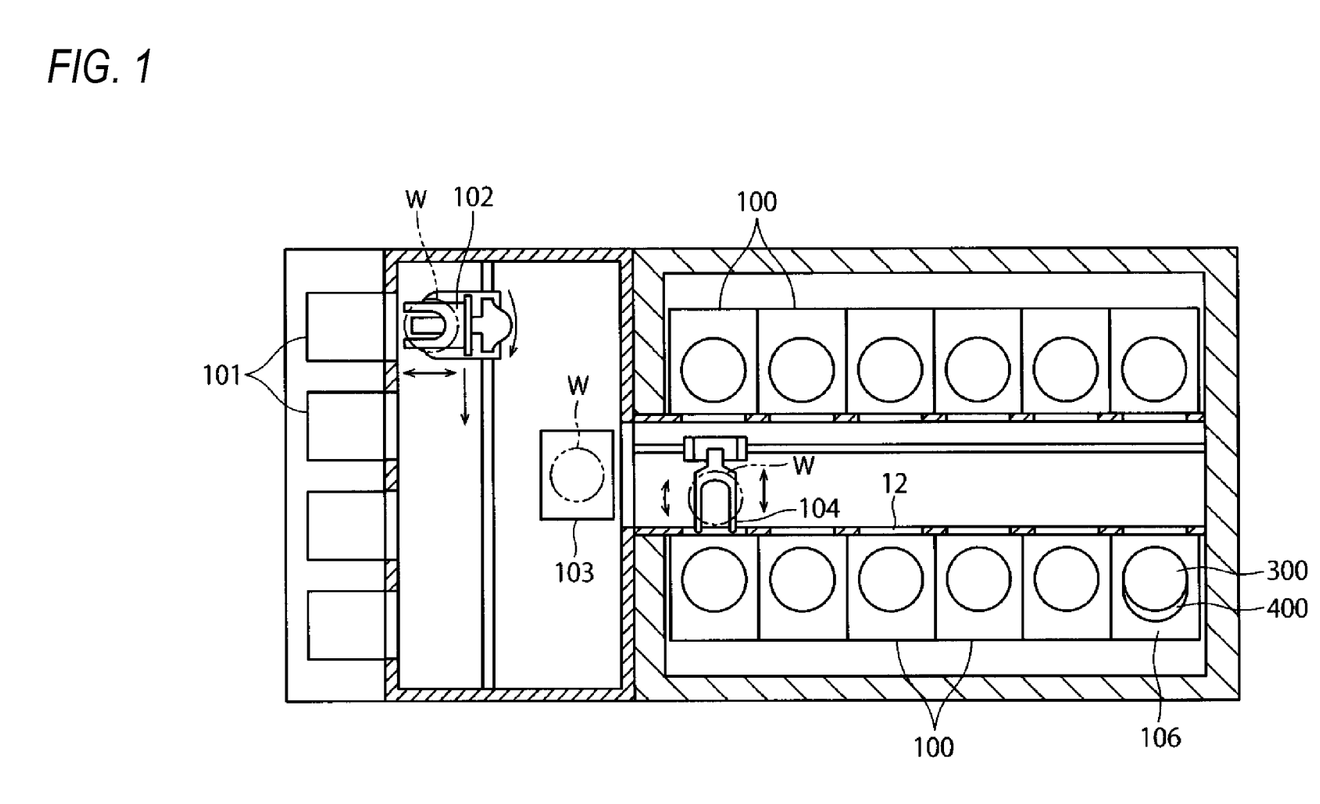
FIG. 1 is a plan view schematically illustrating an overall configuration of a substrate processing system.

Hereinafter, an exemplary embodiment of the present disclosure will be described with reference to accompanying drawings. First, referring to FIG. 1, the overall configuration of a substrate processing system will be described. The substrate processing system includes: a placing unit 101 configured to place a carrier from the outside, the carrier accommodating a semiconductor wafer W (hereinafter, simply referred to as "wafer W") as a substrate to be processed; a conveying arm 102 configured to take out the wafer W accommodated in the carrier; a shelf unit 103 that has a buffer configured to temporarily place the wafer W taken out by the conveying arm 102; and a conveying arm 104 configured to receive the wafer W placed in the shelf unit 103, and to convey the wafer W into a substrate processing apparatus 100. As illustrated in FIG. 1, the liquid processing system is provided with a plurality of substrate processing apparatuses 100, and one storage shelf 106 (storage unit). Two kinds of cleaning jigs 300 and 400 to be described later are stored in the storage shelf 106.

Figure 2:
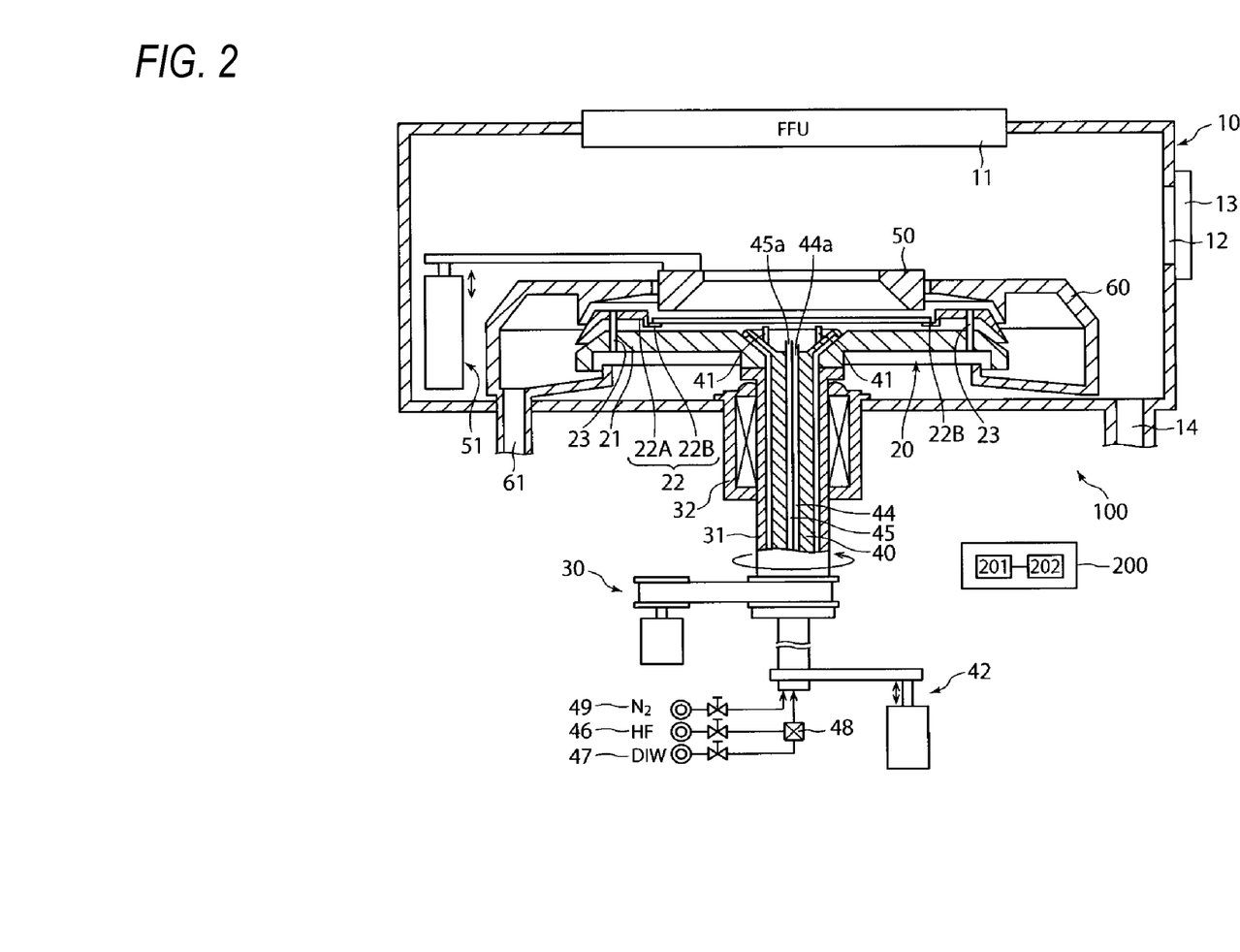
FIG. 2 is a cross-sectional view illustrating the configuration of a substrate processing apparatus included in the substrate processing system illustrated in FIG. 1.

Hereinafter, referring to FIG. 2, the configuration of the substrate processing apparatus 100 that is to be cleaned by a cleaning jig according to the present disclosure will be described. The substrate processing apparatus 100 is configured to perform liquid processing on a semiconductor wafer as a to-be-processed substrate having a front surface formed with a semiconductor device, in which an unnecessary film such as, for example, SiN, attached on the rear surface and the side peripheral surface of the semiconductor wafer is removed by a hydrofluoric acid solution (hereinafter, referred to as "HF solution").

The substrate processing apparatus 100 is provided with a housing 10, a substrate holding unit 20 configured to hold the wafer W horizontally within the housing 10, and a rotation driving mechanism 30 configured to rotate the substrate holding unit 20 around a vertical axis.

A fan filter unit (FFU) 11 is attached at a ceiling portion of the housing 10, and a downflow of clean air is formed in the inner space of the housing 10 by the FFU 11. A carrying-in/out port 12 of the wafer W is formed in one side wall of the housing 10, and may be opened and closed by a shutter 13. An exhaust path 14 configured to exhaust the atmosphere within the housing 10 is provided in the bottom wall of the housing 10.

The substrate holding unit 20 has a base plate 21 formed in a substantially disk-shape. The top surface of the base plate 21 faces the bottom surface of the wafer W when the wafer W is held by the substrate holding unit 20. Here, a gap between the top surface of the base plate 21 and the bottom surface of the wafer W is set to be a predetermined value (for example, 1 mm to 5 mm) such that the wafer W may be pressed with an appropriate force against substrate support pieces 22B to be described later by a negative pressure generated by an airflow (toward the wafer periphery) formed between the base plate 21 and the wafer W through rotation, and also a processing liquid supplied to the central portion of the bottom surface of the wafer W may not be suppressed from flowing toward the periphery of the wafer W. A ring member 22 formed in a substantially annular shape is provided above the base plate 21 to be vertically spaced apart from the base plate 21. The base plate 21 and the ring member 22 are coupled by a plurality of coupling members 23 to be relatively immovable.

The ring member 22 has an annular guide portion 22A, and a plurality of (e.g., 12) substrate support pieces 22B that protrude toward the center of the annular ring from the inner periphery of the bottom surface of the guide portion 22A. While the top surfaces of the substrate support pieces 22B support the bottom surface periphery of the wafer W, the wafer W is horizontally held by the substrate holding unit 20. The substrate support pieces 22B are provided at positions which are equally spaced around the circumference. In FIG. 2, only two substrate support pieces 22B are illustrated. When the wafer W is placed on the substrate support pieces 22B, the guide portion 22A surrounds the periphery of the wafer W. Here, a small gap is formed between the inner periphery of the guide portion 22A and the outer periphery of the wafer W. The guide portion 22A guides a fluid that flows in the vicinity of the periphery of the wafer W when liquid processing is performed on the wafer W.

A hollow cylindrical rotation shaft 31 extends vertically downward from the bottom surface center of the base plate 21. The rotation shaft 31 is rotatably supported by a bearing unit 32. When the rotation driving mechanism 30 rotatably drives the rotation shaft 31, the substrate holding unit 20 and the wafer W held by the substrate holding unit 20 are rotated around the vertical axis.

A cylindrical substrate lifter 40 is inserted through the inside of the rotation shaft 31. A plurality (e.g., 3) of substrate supporting pins 41 are provided at the top portion of the substrate lifter 40. The substrate lifter 40 is supported within the rotation shaft 31 such that it is relatively rotatable with respect to the rotation shaft 31 so as not to be rotated together with the rotation shaft 31 even when the rotation shaft 31 is rotated, and is relatively vertically movable with respect to the rotation shaft 31. The wafer W may be moved up and down by raising or lowering the substrate lifter 40 by an elevating mechanism 42.

A processing liquid supply path 44 configured to supply a processing liquid to the bottom surface of the wafer W held by the substrate holding unit 20, and a gas supply path 45 vertically extend within the substrate lifter 40. A top opening 44a of the processing liquid supply path 44 becomes an ejecting hole of a processing liquid nozzle configured to eject the processing liquid toward the bottom surface of the wafer W. A top opening 45a of the gas supply path 45 becomes an ejecting hole of a drying gas nozzle configured to supply a drying gas toward the bottom surface of the wafer W. An HF solution supply mechanism 46 and a DIW (pure water) supply mechanism 47 are connected to the processing liquid supply path 44, and any one of the HF solution and the DIW may be supplied to the supply path 44 by switching a switching valve 48. A supply mechanism 49 of a nitrogen gas ($N_2$) as a drying gas is connected to the gas supply path 45. The above described supply mechanisms 46, 47, and 49 of the respective processing fluids are constituted by components such as, for example, supply sources of the processing fluids, opening/closing valves, and flow control valves.

The substrate processing apparatus is further provided with a ring-shaped cover member 50. The cover member 50 may be moved by a cover moving mechanism 51 between a processing position (position illustrated in FIG. 2) where the cover member 50 is close to the wafer W held by the substrate holding unit 20 to cover the periphery of the top surface of the wafer W, and a retreat position (not illustrated) (for example, right above the processing position, and higher than the carrying-in/out port 12) where the cover member 50 is retreated from the processing position. The gap between the bottom surface of the cover member 50 at the processing position and the top surface of the wafer W is set to be in a range of, for example, about 1 mm to 2 mm.

A cup body 60 is provided to surround the circumference of the cover member 50 at the processing position and the substrate holding unit 20. The cup body 60 receives and collects a processing fluid of, for example, a chemical liquid scattered from the wafer W during liquid processing of the wafer W. A discharge path 61 is connected to the bottom portion of the cup body 60. The discharge path 61 is connected to a factory exhaust system or a waste liquid system via, for example, a mist separator or an ejector (not illustrated). As illustrated in FIG. 2, when the cover member 50 is positioned at the processing position, the cover member 50 is accommodated within the upper opening formed at the ceiling portion of the cup body 60. Here, a small gap is formed between the inner peripheral surface of the upper opening formed at the ceiling portion of the cup body 60 and the outer peripheral surface of the cover member 50.

The substrate processing system has a controller (control unit) 200 (illustrated only in FIG. 2) configured to perform overall control of all operations. The controller 200 controls operations of all functional components (for example, the conveying arms 102 and 104, and various driving mechanisms and supply control mechanisms of various processing fluids within the substrate processing apparatus 100) included in the substrate processing system. The control of the controller 200 may be achieved by, for example, a general purpose computer that is a hardware, and a program (such as a device control program and a processing recipe) configured to operate the computer, that is a software. The software is stored in a storage medium fixedly provided to the computer, such as, for example, a hard disk drive, or stored in a storage medium detachably set in the computer, such as, for example, a CD-ROM, a DVD, or a flash memory. Such a storage medium is indicated by a reference numeral 201 in FIG. 2. A processor 202 retrieves and executes a predetermined processing recipe from the storage medium 201 based on, for example, a command from a user interface (not illustrated), if necessary. By this, respective functional components of the substrate processing system are operated under the control of the controller 200, thereby performing predetermined processes.

Hereinafter, liquid processing on the wafer W having a front surface formed with a semiconductor device will be described, in which an unnecessary film such as, for example, SiN, attached on the rear surface and the side peripheral surface of the wafer W is removed by a HF solution by using the above described substrate processing apparatus. A series of processes to be described below are performed while the controller 200 controls the operations of the respective functional components of the substrate processing system.

A wafer W that has not been processed is taken out by the conveying arm 102 from the carrier of the placing unit 101 to be placed on the shelf unit 103. The conveying arm 104 takes out the wafer W from the shelf unit 103, and enters the inside of the housing 10 of the substrate processing apparatus via the carrying-in/out port 12 while the shutter 13 is opened, thereby placing the wafer W on the substrate supporting pins 41 of the substrate lifter 40 at a raised position. Then, the substrate lifter 40 moves down while the wafer W is placed on the substrate support pieces 22B of the substrate holding unit 20, and is separated from the substrate lifter 40. Then, the cover member 50 moves from the retreat position to the processing position (the position illustrated in FIG. 2). In this manner, the state illustrated in FIG. 2 is made.

Then, the wafer W is rotated by the rotation driving mechanism 30, and the HF solution is supplied from the top opening 44a of the processing liquid supply path 44 provided in the substrate lifter 40 to the bottom surface (a surface not formed with a device) of the wafer W. The HF solution flows on the bottom surface of the wafer W toward the periphery by a centrifugal force, thereby removing an unnecessary film such as, for example, SiN.

After the chemical liquid processing by the HF solution is performed for a predetermined time, the ejection of the HF solution from the top opening 44a is stopped and the DIW is supplied to the rear surface of the wafer W from the top opening 44a while the wafer W is continuously rotated. By this, rinse processing of the wafer W is performed.

After the rinse processing by the DIW is performed for a predetermined time, the ejection of the DIW from the top opening 44a is stopped and the nitrogen gas is ejected from the top opening 45a of the gas supply path 45 while the wafer W is continuously rotated. By this, spin-drying processing of the wafer W is performed. As described above, a series of processes on the wafer W are finished.

When the processes on the Wafer W are finished, the rotation of the wafer W is stopped. The cover member 50 is moved up to the retreat position, the wafer W is lifted by the substrate lifter 40, and the shutter 13 is opened. The conveying arm 104 in an empty state enters the inside of the housing 10 via the carrying-in/out port 12 to be positioned just below the wafer W. Then, the substrate lifter 40 is moved down to deliver the wafer W to the conveying arm 104, and then the conveying arm 104 is retreated from the housing 10. The wafer W is returned into the carrier of the placing unit 101 through the reverse route to that of carrying-in.

Figure 3:
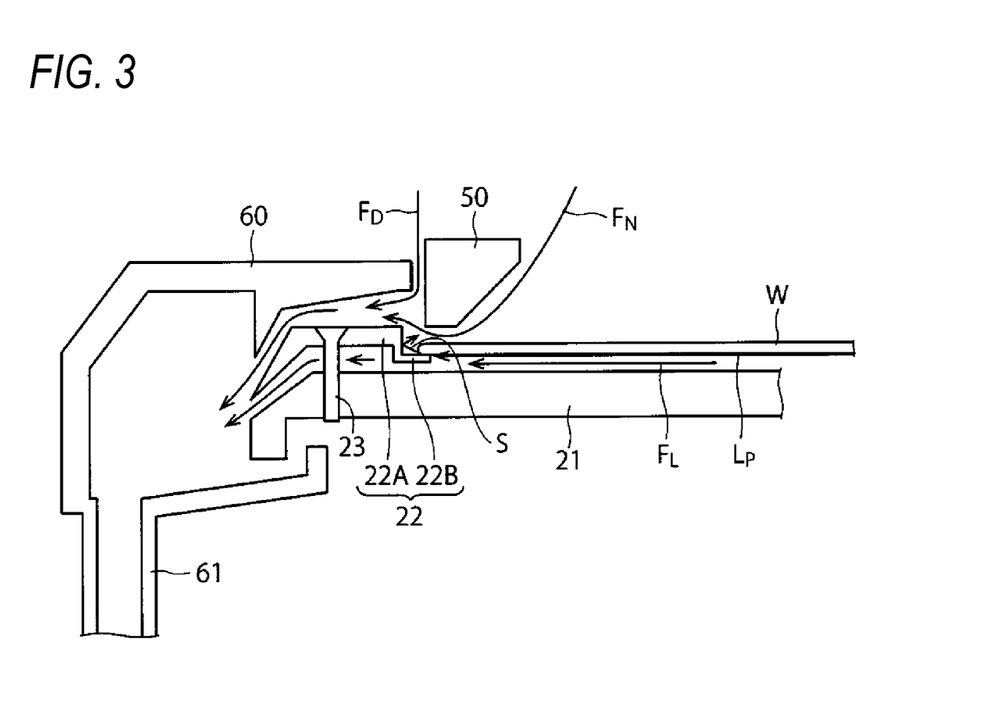
FIG. 3 is a view illustrating a flow of a processing liquid and an airflow around a wafer when the wafer is subjected to liquid processing.

The airflow around the wafer W when the chemical liquid processing is performed by the HF solution is illustrated in FIG. 3. An airflow ($F_L$) toward the periphery of the wafer W is generated in the space between the bottom surface of the wafer and the base plate 21. The airflow ($F_L$) flows toward the discharge path 61 through the space between the bottom surface of the guide portion 22A of the ring member 22 and the base plate 21. The HF solution ($L_P$) supplied to the bottom surface of the Wafer W flows together with the airflow ($F_L$) toward the discharge path 61 through the space between the bottom surface of the guide portion 22A of the ring member 22 and the base plate 21. The airflow ($F_L$) allows the space between the bottom surface of the wafer and the base plate 21 to be placed in a decompressed state, and thus the wafer W is pressed against the substrate support pieces 22B to be securely held by the substrate holding unit 20. Since the inside of the cup body 60 is exhausted via the discharge path 61, the downflow of clean air from the FFU 11 is drawn into the large-diameter central opening of the ring-shaped cover member 50, and is drawn into the cup body 60 via the gap between the bottom surface of the cover member 50 and the top surface of the wafer W, as indicated by the arrow ($F_N$). Also, the downflow of clean air from the FFU 11 is drawn into the cup body 60 from the gap between the inner peripheral surface of the upper opening of the cup body 60 and the outer peripheral surface of the cover member 50, as indicated by the arrow (FD). By the above described airflow, the processing liquid (HF solution) which has been supplied to the bottom surface of the wafer W and scattered outward, and mists thereof are significantly suppressed from being crowded toward the top surface side of the wafer W.

However, in actuality, for example, there are mists of the processing liquid which are directed toward the cover member 50 by colliding with the inner peripheral surface of the guide portion 22A through the gap between the substrate support pieces 22B which are adjacent in the circumferential direction (see the arrow S). Further, for example, in the inner space of the cup body 60, the internal pressure of the cup body 60 may be increased due to an inner wall shape of the cup body or for other reasons, and thus mists may flow by being entrained in airflow flowing back toward the wafer W or the cover member 50. Accordingly, while the liquid processing is repeatedly performed, deposits caused from the processing liquid are formed on members at positions higher than the top surface of the wafer W, that is, the upper portion of the cup body 60 and the surface of the cover member 50. The deposits may cause particle contamination, and thus require to be regularly cleaned. Hereinafter, a cleaning jig configured to clean such portions will be described.

Figure 4A:
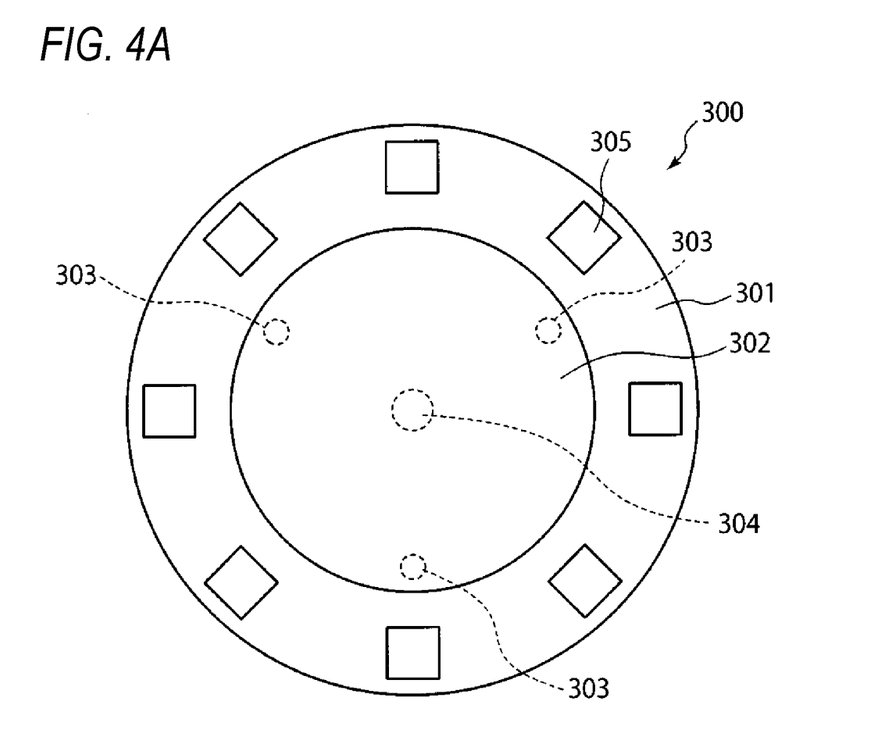
FIG. 4A is a plan view.
Figure 4B:
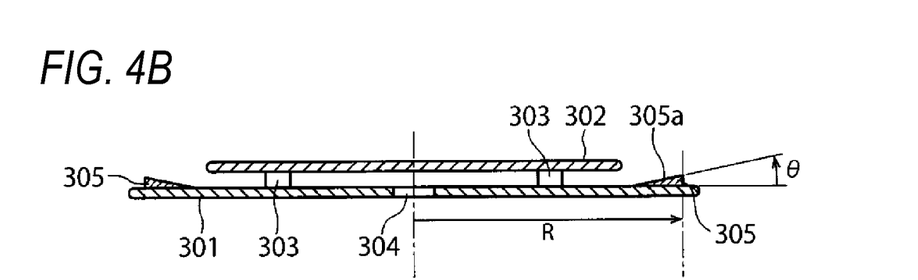
FIG. 4B is a cross-sectional view.

As illustrated in FIGS. 4A and 4B, the cleaning jig 300 has a disk-shaped lower member 301, and a disk-shaped upper member 302 which is provided to be vertically spaced apart from the lower member 301. The diameter of the upper member 302 is smaller than the diameter of the lower member 301. The lower member 301 is held by the substrate holding unit 20 that holds the product wafer (wafer W), and thus preferably has the same shape and the same dimension as those of the wafer W. In the present exemplary embodiment, the lower member 301 is constituted by a disk-shaped member that has the same diameter as the wafer W. Meanwhile, when the substrate holding unit of the substrate processing apparatus is a mechanical chuck configured to clamp the product wafer from the lateral side of the wafer, the lower member 301 preferably has the same diameter and the same thickness as the product wafer. In a case of a substrate holding unit configured to hold the product wafer from the bottom side, like the substrate holding unit 20 according to the present exemplary embodiment, the thickness of the lower member 301 may be different from that of the product wafer. The lower member 301 and the upper member 302 are connected to each other through a plurality of connecting members 303. An opening 304 is formed at a central portion of the lower member 301. A plurality of (in the illustrated example, 8) inclined guide portions 305 are provided at a peripheral portion of the top surface of the lower member 301 to be spaced apart from each other in the circumferential direction. The cleaning jig 300 is stored in the storage shelf 106 illustrated in FIG. 1. The additional cleaning jig 400 is also stored in the storage shelf 106. The cleaning jig 400 has the same shape as the product wafer, and a detailed description thereof is omitted.

Hereinafter, descriptions will be made on a method of cleaning components of the substrate processing apparatus 100 around the wafer W (the cup body 30, and the cover member 50), especially, portions at height positions higher than the top surface of the wafer W held by the substrate holding unit 20 by using the cleaning jig 400, and the cleaning jig 300 as illustrated in FIGS. 4A and 4B. A series of processes to be described below are performed when the controller 200 controls operations of the respective functional components of the substrate processing system.

Figure 5A:
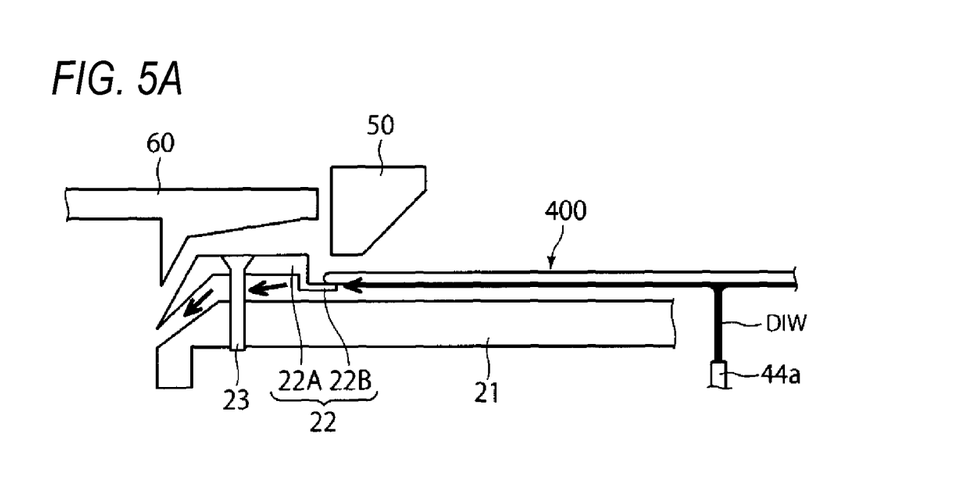
FIGS. 5A and 5B are views illustrating cleaning processing.

The conveying arm 104 illustrated in FIG. 1 takes out the cleaning jig 400 that has the same shape as the product wafer from the storage shelf 106, and carries the cleaning jig 400 into the substrate processing apparatus 100 in the same order as in carrying-in of the product wafer so that the cleaning jig 400 is held by the substrate holding unit 20. That is, the cleaning jig 400 is held by the substrate holding unit 20 in a state illustrated in FIG. 2. In this state, the cleaning jig 400 is rotated by the rotation driving mechanism 30, and DIW is supplied as a cleaning liquid to the bottom surface of the cleaning jig 400 from the top opening 44a of the processing liquid supply path 44 provided in the substrate lifter 40. Then, as illustrated in FIG. 5A, the DIW supplied to the bottom surface of the cleaning jig 400 is scattered to the outside of the cleaning jig 400 by a centrifugal force, and collide with the guide portion 22A and the substrate support pieces 22B of the ring member 22, the coupling member 23, and the base plate 21 to wash out the deposits attached on the surfaces of these members. Here, the inside of the cup body 60 is exhausted via the discharge path 61. When the rotation speed of the substrate holding unit 20 is changed, or the flow rate of the DIW ejected from the top opening 44a is changed during cleaning, scattering situation of the DIW is changed such that various portions of the members may be thoroughly cleaned. In cleaning using the cleaning jig 400, surfaces of members at height positions lower than the bottom surface of the cleaning jig 400 are mainly cleaned.

After the cleaning using the cleaning jig 400 is continued for a predetermined time, the ejection of the DIW from the top opening 44a is stopped and a nitrogen gas is ejected from the top opening 45a of the gas supply path 45 while the cleaning jig 400 is continuously rotated. By this, spin-drying of the cleaning jig 400 is performed. Meanwhile, the cleaning jig 400 may be dried only by shaking-off, without the nitrogen gas ejected from the top opening 45a.

When the cleaning jig 400 is dried, the cleaning jig 400 is carried out from the substrate processing apparatus 100 to be returned to the storage shelf 106 by the conveying arm 104 in the same order as in carrying-out of the product wafer W. Then, the conveying arm 104 takes out the cleaning jig 300 illustrated in FIGS. 4A and 4B from the storage shelf 106, and carries the cleaning jig 300 into the substrate processing apparatus 100 in the same order as in carrying-in of the product wafer W so that the cleaning jig 300 is held by the substrate holding unit 20.

Figure 5B:
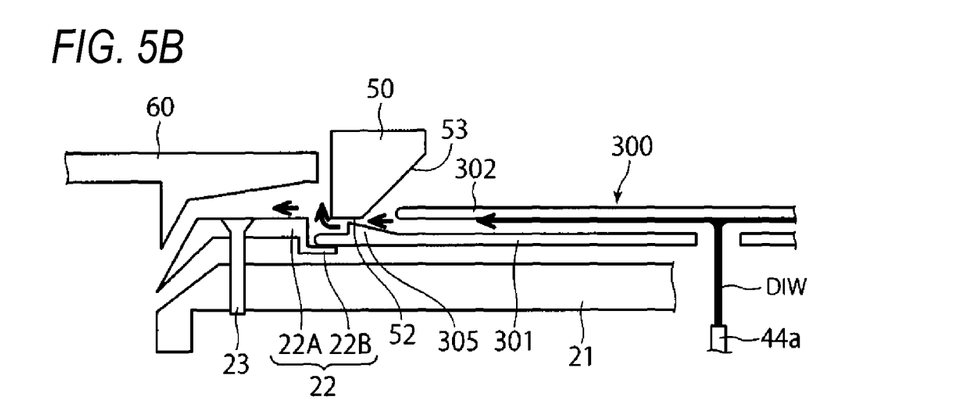

The cleaning jig 300 held by the substrate holding unit 20 is rotated, and the DIW is supplied toward the central portion of the cleaning jig 300 from the top opening 44a of the processing liquid supply path 44 provided in the substrate lifter 40. Then, as illustrated in FIG. 5B, the DIW ejected from the top opening 44a collides the central portion of the bottom surface of the upper member 302 via the opening 304 of the lower member 301, and flows and spreads toward the peripheral portion via a gap between the top surface of the lower member 301 and the bottom surface of the upper member 302 to be shaken off from the cleaning jig 300 and scattered outwards. By the DIW scattered from the cleaning jig 300, surfaces of members at positions higher than the members cleaned by the cleaning jig 400, specifically, for example, the bottom surface 52 and the outer peripheral surface of the cover member 50, and the top surface of the guide portion 22A are mainly cleaned (see the short arrow at the left side in FIG. 5B). Here, the inside of the cup body 60 is exhausted via the discharge path 61.

After the cleaning using the cleaning jig 300 is continued for a predetermined time, the ejection of the DIW from the top opening 44a is stopped and the nitrogen gas is ejected from the top opening 45a of the gas supply path 45 while the cleaning jig 300 is continuously rotated. By this, spin-drying of the cleaning jig 300 is performed. The rotation of the cleaning jig generates a swirling flow, which may dry the cover member 50 that is not rotated. Meanwhile, the cleaning jig 300 may be dried only by shaking-off, without the nitrogen gas ejected from the top opening 45a.

When the cleaning jig 300 is dried, the cleaning jig 300 is carried out from the substrate processing apparatus 100 to be returned to the storage shelf 106 by the conveying arm 104 in the same order as in carrying-out of the product wafer W. As described above, the cleaning of the substrate processing apparatus 100 is finished.

Figure 6A:
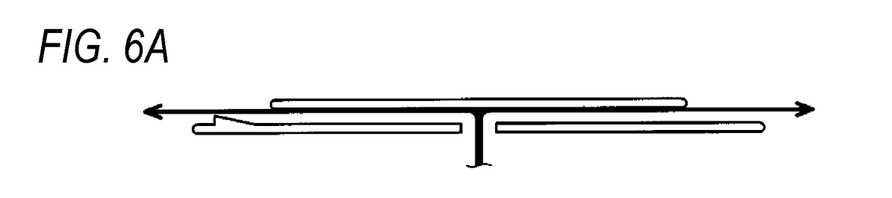
FIGS. 6A to 6C are views illustrating a flow of a cleaning liquid supplied to the cleaning jig.
Figure 6B:
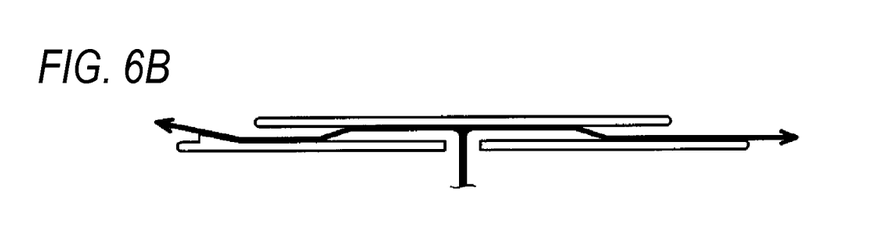
Figure 6C:
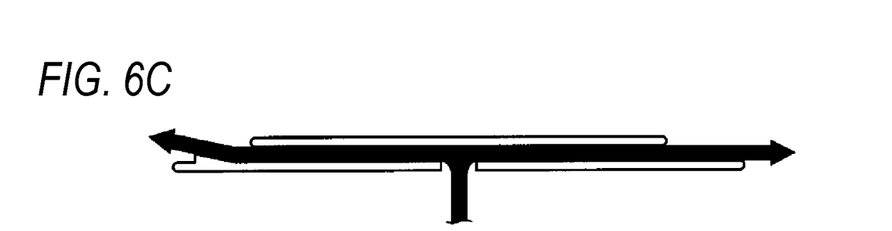

In the cleaning by the cleaning jig 300, when the rotation speed of the cleaning jig 300 is high, most of the DIW supplied to the central portion of the bottom surface of the upper member 302 reaches the periphery of the bottom surface of the upper member 302, and from the position, substantially horizontally jumps out to the outside (see FIG. 6A). When the rotation speed of the cleaning jig 300 is low, most of the DIW supplied to the central portion of the bottom surface of the upper member 302 falls on the top surface of the lower member 301 before reaching the peripheral portion of the bottom surface of the upper member 302, and flows toward the peripheral portion of the top surface of the lower member 301 (see FIG. 6B). One part of The DIW flowing on the top surface of the lower member 301, which flows on the inclined guide portions 305, upwardly obliquely jumps out to the outside from the inclined guide portions 305 (see the left side in FIG. 6B). Another part of the DIW, which does not flow on the inclined guide portions 305, substantially horizontally jumps out to the outside from the periphery of the top surface of the lower member 301 (see the right side in FIG. 6B). Accordingly, by changing the rotation speed of the cleaning jig 300, the trajectory of the DIW that jumps out from the cleaning jig 300 may be changed. Further, by changing the rotation speed of the cleaning jig 300 during cleaning, it is possible to change the ratio of one part of the cleaning liquid which reaches the bottom surface of the upper member 302, and then flows along the bottom surface of the upper member 302 to be shaken off from the peripheral portion of the bottom surface, to another part of the cleaning liquid which falls on the top surface of the lower member 301 from the bottom surface of the upper member 302, and is shaken off from the peripheral portion of the top surface of the lower member 301. Also, the trajectory of the DIW that jumps out from the cleaning jig 300 may be changed by changing the flow rate (water energy) of the DIW ejected from the top opening 44a. Accordingly, the trajectory of the DIW may be variously changed by changing the combination of the rotation speed of the cleaning jig 300 and the flow rate of the DIW ejected from the top opening 44a. Further, by changing the ejection flow rate of the cleaning liquid, and the rotation speed of the cleaning jig 300 during cleaning, it is possible to change the ratio of one part of the cleaning liquid which reaches the bottom surface of the upper member 302, and then flows along the bottom surface of the upper member 302 to be shaken off from the peripheral portion of the bottom surface, to another part of the cleaning liquid which falls on the top surface of the lower member 301 from the bottom surface of the upper member 302, and is shaken off from the peripheral portion of the top surface of the lower member 301. Meanwhile, the ejection flow rate of the DIW is set to be very high, the DIW substantially fully fills the gap between the lower member 301 and the upper member 302 while flowing outwards (see FIG. 6C).

The shape or setting position of at least one of the inclined guide portions 305 is set to be different from the shape of other inclined guide portions 305, the trajectories of the DIW that jumps out from the inclined guide portions 305 may be different from each other. Specifically, for example, the distance (R) from the center of the cleaning jig 300 to the outer edge of the inclined guide portions 305, and the inclination angle (θ) of the inclined guide portions 305 with respect to the horizontal plane of the top surface 305a may be changed (see FIG. 4B).

When cleaning is performed on a movable (especially, in a vertical direction) cleaning object such as the cover member 50, various portions of the cleaning object may be cleaned by moving the cleaning object during the cleaning. In this case, for example, the setting position of the inclined guide portions 305 may be moved radially inward from the position illustrated in FIG. 5B. Then, an inner inclined surface 53 of the cover member 50 may be cleaned. Also, when the cover member 50 is slightly raised, the bottom surface 52 of the cover member 50 may be cleaned.

As described above, when the cleaning jig 300 is used, members at positions higher than the top surface of the product wafer (wafer W) held by the substrate holding unit 20 may be cleaned without a dedicated cleaning liquid supply unit provided above the substrate holding unit 20. Accordingly, it is possible to lower a device cost for the substrate processing apparatus which does not have a unit configured to supply a processing liquid (e.g., a rinse liquid that may be used as a cleaning liquid) to the top surface of the product wafer. That is, when the cleaning jig 300 according to the above described exemplary embodiment is used, the top opening 44a as a rinse liquid nozzle configured to eject DIW to the center of the bottom surface of the wafer W at the time of rinse processing on the product wafer (wafer W) may be diverted as a unit configured to eject a cleaning liquid for cleaning members of the substrate processing apparatus. Thus, the device cost for the substrate processing apparatus may be lowered.

In the above described exemplary embodiment, the product wafer W and the cleaning jigs 300 and 400 are carried into or carried out from the substrate processing apparatus 100 by using a substrate conveyor having one conveying arm 104, but the present disclosure is not limited thereto. Another substrate conveyor having two upper and lower conveying arms may be used to exchange a processed wafer W with a non-processed wafer, and cleaning jigs 300 and 400 with each other. The cleaning jig 300 necessarily has a higher height than the product wafer. Thus, it is preferable that the cleaning jig 300 is designed such that the cleaning jig 300 does not interfere with the upper conveying arm even if the cleaning jig 300 is placed on the lower conveying arm. Otherwise, it is preferable that the order of carrying-in/out is set such that the cleaning jig 300 is always handled by the upper conveying arm.

Figure 7:
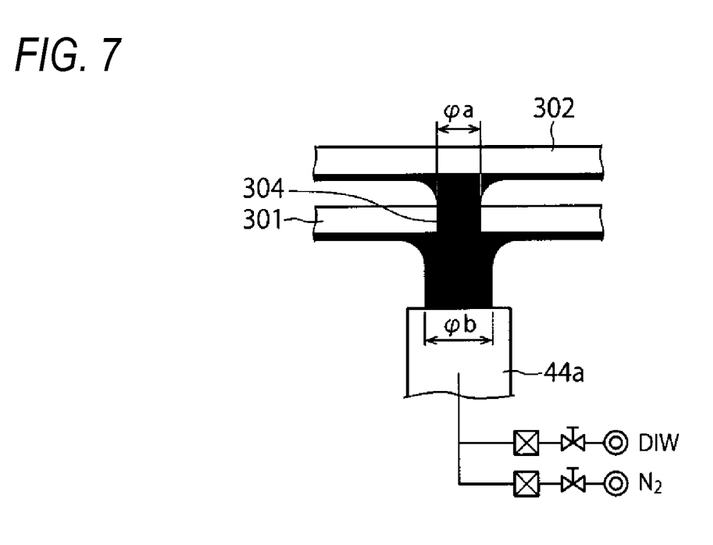
FIG. 7 is a view illustrating another exemplary embodiment of the cleaning jig.

In the above described exemplary embodiment, two kinds of cleaning jigs 300 and 400 are used to clean the substrate processing apparatus, but the present disclosure is not limited thereto. As illustrated in FIG. 7, the diameter (φa) of the opening 304 may be set to be smaller than diameter (φb) (which is almost the same as the opening diameter of the top opening 44a) of a liquid column of DIW ejected from the top opening 44a, such that the central portion of the liquid column of the DIW collides with the bottom surface of the upper member 302 via the opening 304 and also the peripheral portion of the liquid column of the DIW collides with the bottom surface of the lower member 301. In this manner, without using the cleaning jig 400, a wide height range may be cleaned. Meanwhile, in this case, as illustrated in FIG. 7, the top opening 44a is preferably configured to eject a drying gas (nitrogen gas) for drying the cleaning jig 300 as well as the DIW. In this case, especially, it is preferable that the center (that is, the rotation center of the cleaning jig 300) of the opening 304 is matched with the center of the top opening 44a.

In the above described exemplary embodiment, the substrate holding unit 20 holds the periphery of the bottom surface of the wafer W by the substrate support pieces 22B from bottom side, but the present disclosure is not limited thereto. The substrate holding unit may be a so-called mechanical chuck configured to clamp the periphery of the wafer W by a movable clamping claw. Further, the cleaning jig may be used to clean only a cup of a substrate processing apparatus not provided with a cover member. The substrate processing apparatus may be configured to supply a processing liquid to a surface formed with a device when a substrate holding unit holds a wafer W having a bottom-side surface formed with the device. For example, there is no limitation in the configuration of the substrate processing apparatus as an object to be cleaned as long as the substrate processing apparatus has a cleaning liquid supply unit configured to supply a cleaning liquid to a central portion of a bottom surface of a product wafer held by the substrate holding unit. When the substrate processing apparatus has such a cleaning liquid supply unit, the lower member of the cleaning jig is held by the substrate holding unit, and the cleaning liquid is supplied to the bottom surface of the upper member via the opening formed in the lower member and is scattered to clean a higher position.

In the above described exemplary embodiment, the DIW used for rinse processing of the product wafer is used for cleaning the substrate processing apparatus, but the present disclosure is not limited thereto. When a processing liquid (for example, a chemical liquid) used for liquid processing of the product wafer is usable for cleaning the substrate processing apparatus, such a processing liquid may be used to clean the substrate processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of cleaning a substrate processing apparatus to clean components of the substrate processing apparatus, the components having been positioned around a product substrate held by a substrate holding unit at the time of liquid processing of the product substrate, the method comprising:
providing a first cleaning jig which includes a disk-shaped lower member having an opening formed at a central portion thereof, and a disk-shaped upper member connected to the lower member and forming a gap between the upper member and the lower member;
holding the lower member of the first cleaning jig by the substrate holding unit;
rotating the substrate holding unit around a vertical axis to rotate the first cleaning jig; and
ejecting a cleaning liquid toward the first cleaning jig from a bottom side of the first cleaning jig while the first cleaning jig is rotated, such that the cleaning liquid is passed through the opening of the lower member to reach a bottom surface of the upper member,
wherein the cleaning liquid that has reached the bottom surface of the upper member flows out toward outside of the first cleaning jig via the gap between the upper member and the lower member,
the components of the substrate processing apparatus are cleaned by the cleaning liquid that has flowed out, and
the lower member of the first cleaning jig is a disk-shaped member that has the same diameter as the product substrate processed by the substrate processing apparatus, and the upper member is a disk-shaped member that has a smaller diameter than the lower member.

2. The method of claim 1, wherein an inclined guide portion is provided at a peripheral portion of a top surface of the lower member, and
the cleaning liquid that flows on the top surface of the lower member toward the peripheral portion obliquely upwardly turns by the inclined guide portion to jump out from the lower member.

3. The method of claim 1, further comprising changing at least one of an ejection flow rate of the cleaning liquid and a rotation speed of the first cleaning jig while the substrate processing apparatus is cleaned.

4. The method of claim 1, wherein a ratio of one part of the cleaning liquid which reaches the bottom surface of the upper member and then flows along the bottom surface of the upper member to be shaken off from a peripheral portion of the bottom surface, to another part of the cleaning liquid which falls on a top surface of the lower member from the bottom surface of the upper member and is shaken off from a peripheral portion of the top surface, is changed by changing a rotation speed of the first cleaning jig while the substrate processing apparatus is cleaned.

5. The method of claim 1, wherein a ratio of one part of the cleaning liquid which reaches the bottom surface of the upper member and then flows along the bottom surface of the upper member to be shaken off from a peripheral portion of the bottom surface, to another part of the cleaning liquid which falls on a top surface of the lower member from the bottom surface of the upper member and is shaken off from a peripheral portion of the top surface, is changed by changing an ejection flow rate of the cleaning liquid and a rotation speed of the first cleaning jig while the substrate processing apparatus is cleaned.

6. The method of claim 1, wherein the cleaning liquid is ejected toward the first cleaning jig from a processing liquid nozzle which is configured to supply a processing liquid toward a central portion of a bottom surface of the product substrate from a bottom side of the product substrate held by the substrate holding unit when the product substrate is processed by the substrate processing apparatus.

7. The method of claim 1, wherein a diameter of the opening of the lower member is smaller than a diameter of a liquid column of the cleaning liquid ejected toward the first cleaning jig, by which a part of the cleaning liquid ejected toward the first cleaning jig reaches the bottom surface of the upper member through the opening, and flows toward outside through the gap between the upper member and the lower member, and another part of the cleaning liquid ejected toward the first cleaning jig reaches a bottom surface of the lower member, and flows along the bottom surface of the lower member toward outside.

8. The method of claim 1, further comprising
providing a second cleaning jig constituted by a disk-shaped member having a diameter corresponding to the product substrate processed by the substrate processing apparatus;
holding the second cleaning jig by the substrate holding unit;
rotating the substrate holding unit around the vertical axis to rotate the second cleaning jig; and
ejecting the cleaning liquid toward a bottom surface of the second cleaning jig from a bottom side of the second cleaning jig while the second cleaning jig is rotated, such that the cleaning liquid flows along the bottom surface of the second cleaning jig toward outside, and is shaken off from the bottom surface of the second cleaning jig to clean a portion lower than a portion to be cleaned by the first cleaning jig.

* * * * *